(12) United States Patent
Fitzgerald et al.

(10) Patent No.: US 6,495,868 B2
(45) Date of Patent: Dec. 17, 2002

(54) RELAXED $IN_XGA_{1-X}AS$ BUFFERS

(75) Inventors: Eugene A. Fitzgerald, Windham, NH (US); Mayank T. Bulsara, Cambridge, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 09/804,890

(22) Filed: Mar. 13, 2001

(65) Prior Publication Data

US 2001/0040244 A1 Nov. 15, 2001

Related U.S. Application Data

(63) Continuation-in-part of application No. 09/198,960, filed on Nov. 24, 1998, now Pat. No. 6,232,183.
(60) Provisional application No. 60/067,189, filed on Dec. 1, 1997.

(51) Int. Cl.[7] .......................... H01L 33/00; H01L 29/78
(52) U.S. Cl. ........................................ 257/191; 257/192
(58) Field of Search .................................. 257/191, 192

(56) References Cited

U.S. PATENT DOCUMENTS

| | | | | |
|---|---|---|---|---|
| 5,060,028 A | * | 10/1991 | Kuo et al. | |
| 5,331,185 A | * | 7/1994 | Kuwata | |
| 5,677,553 A | * | 10/1997 | Yamamoto et al. | |
| 5,751,030 A | * | 5/1998 | Fujimoto et al. | |
| 6,107,648 A | * | 8/2000 | Shakuda et al. | |

FOREIGN PATENT DOCUMENTS

EP          755379 A1   *   6/1996

OTHER PUBLICATIONS

Krishniamoorthy et al., ""Application of Critical Compositional Difference" Concept to the Growth of Low Dislocation Density (($<10^4/cm^2$) $In_xGa_{1-x}As$ ($x \leq 0.5$) on GaAs," *J. Appl. Phys.*, vol. 72, No. 5, (Sep. 1, 1992): 1752–1757.

Chang et al., "Strain Relaxation of Compositionally Graded $In_xGa_{1-x}As$ Buffer Layers for Modulation–doped $In_{0.3}Ga_{0.7}As$ Heterostructures," *Appl. Phys. Lett.*, vol. 60 No. 9, (Mar. 2, 1992): 1129–1131.

Lord et al., "Graded Buffer Layers for Molecular Beam Epitaxail Growth of High In Content InGaAs On GaAs For Optoelectronics," *Mat. Res. Soc. Symp. Proc.*, vol. 281, (1993): 221–225.

Molina et al., "Strain Relief in Linearly Composition Buffer Layers: A Design Scheme to Grow Dislocation–Free ($<10^5 cm^{-2}$) and Unstrained Epilayers," *Appl. Phys. Lett.*, vol. 65 No. 19, (Nov. 7, 1994): 2460–2462.

Goorsky et al., "Structural Properties of Highly Mismatched InGaAs–Based Devices Grown by Molecular Beam Epitaxy on GaAs Substrates," *J. Vac. Sci. Technol.*, (Mar./Apr. 1994): 1034–1037.

(List continued on next page.)

*Primary Examiner*—Stephen D. Meier
(74) *Attorney, Agent, or Firm*—Testa, Hurwitz & Thibeault, LLP

(57) ABSTRACT

$In_xGa_{1-x}As$ structures with compositionally graded buffers grown with organometallic vapor phase epitaxy (OMPVE) on GaAs substrates. A semiconductor structure and a method of processing such a structure including providing a substrate of GaAs; and epitaxially growing a relaxed graded layer of $In_xGa_{1-x}As$ at a temperature ranging upwards from about 600° C.

18 Claims, 5 Drawing Sheets

COMPOSITION, GRADING RATES, RELAXATION, AND X-RAY DATA FOR $X_{in}$ =0.06 FOR STRUCTURES GROWN AT DIFFERENT TEMPERATURES

| GROWTH TEMP(°C) | % INDIUM IN GRADED BUFFER | GRADING RATE (% In/μm) | RESIDUAL ε (x10⁻³) | % OF EQUILIBRIUM ε RELIEVED | 2θ FWHM FOR $In_xGa_{1-x}As$ CAP LAYER | ω FWHM FOR $In_xGa_{1-x}As$ CAP LAYER |
|---|---|---|---|---|---|---|
| 500 | 9.81 | 15.32 | -2.15 | 79 | 233 | 505 |
| 550 | 8.21 | 11.90 | -1.59 | 85 | 283 | 356 |
| 600 | 6.06 | 8.81 | -1.41 | 84 | 151 | 512 |
| 650 | 7.76 | 8.21 | -1.28 | 89 | 144 | 415 |
| 700 | 7.14 | 7.51 | -1.59 | 79 | 109 | 460 |

OTHER PUBLICATIONS

Molina et al., "Dislocation Distribution in Graded Composition InGaAs Layers," *Mat. Res. Soc. Symp. Proc.*, vol. 325, (1994): 223–228.

Ferrari et al., "Mechanisms of Strain Release in Molecular Beam Epitaxy Grown InGaAs/GaAs Buffer Heterostructures," *Materials Science and Engineering*, (1994): 510–514.

Sigle et al. Strain Relaxation in Graded InGaAs And InP Buffer Layers On GaAs (001), *Scanning Microscopy*, vol. 8 No. 4 (1994): 897–904.

Goldman et al., "Strain Relaxation In Compositionally Graded InGaAS/GaAs Heterosctructures," *Scanning Microscopy*, vol. 8, No. 1, (1994): 905–912.

Eldredge et al., "Effect of Substrate Miscut on the Structural Properties of InGaAs Linear Graded Buffer Layers Grown by Molecular–Beam Epitaxy on GaAs," *J. Vac. Sci. Technol.*, vol. 13 No. 2 (Mar./Apr. 1995): 689–691.

Rammohan et al., Study of αm—scale Spatioal Variations in Strain of a Compositionally Step–Graded $In_xGa_{1-x}As$/ GaAs(001) Heterostructure, *Appl. Phys. Lett.*, vol. 66 No. 7, (Feb. 13, 1995): 869–871.

Goldman et al., Effects of Substrate Misorientation Direction On Strain Relaxation At InGaAs/GaAs(001) Interfaces, *Mat. Res. Soc. Symp. Proc.*, vol. 379, (1995): 21–16.

Lee et al., "Reduction of Defects In Highly Lattice Mismatched InGaAs Grown On GaAs By MOCVD," *Mat. Res. Soc. Symp.*, vol. 355, (1995): 649–654.

Goldman et al., "Correlation of Buffer Strain Relaxation Modes with Transport Properties of Two–Dimensional Electron Gases," *J. Appl. Phys.*, vol. 80 No. 12, (Dec. 15, 1996): 6849–6854.

Chyi et al. Material Properties of Compositional Graded $In_xGa_{1-x}As$ and $In_xAl_{1-x}As$ Epilayers Grown on GaAs Substrates, *J. Appl. Phys.*, vol. 79 No. 11, (Jun. 1, 1996): 8367–8370.

Lee et al., "Optical Properties of InGaAs Linear Graded Buffer Layers on GaAs Grown by Metalorganic Chemical Vapor Deposition," *Appl. Phys. Lett.*, (May 20, 1996).

Uchida et al., "A 1.3 αm Strained Quantum Well Laser on a Graded InGaAs Buffer with a GaAs Substrate," *Journal of Electronic Materials*, vol. 25 No. 4 (1996): 581–584.

Valtueña et al., "Influence of the Surface Morphology on the Relaxation of Low–Strain $In_xGa_{1-x}As$ Linear Buffer Structure," *Journal of Crystal Growth*, (1997): 281–291.

Uchida et al., "CW Operation of a 1.3–αm Strained Quantum Well Laser on a Graded InGaAs Buffer with a GaAs substrate", Proceedings of the International Conference on Indium Phosphate and related materials, Conf. 7, May 9, 1995, pp. 22–25.

Bulsara et al., "Relaxed $In_xGA_{(1-x)}As$ graded buffers grown with organometallic vapor phase epitaxy on GaAs", Applied Physics Letters, vol. 72, No. 13, Mar. 30,1998, pp. 1608–1610.

* cited by examiner

COMPOSITION, GRADING RATES, RELAXATION, AND X-RAY DATA FOR $x_{in}$ = 0.06 FOR STRUCTURES GROWN AT DIFFERENT TEMPERATURES

| GROWTH TEMP (°C) | % INDIUM IN GRADED BUFFER | GRADING RATE (%In/μm) | RESIDUAL ε (x10⁻³) | % OF EQUILIBRIUM ε RELIEVED | 2θ FWHM FOR In$_x$Ga$_{1-x}$As CAP LAYER | ωFWHM FOR In$_x$Ga$_{1-x}$As CAP LAYER |
|---|---|---|---|---|---|---|
| 500 | 9.81 | 15.32 | -2.15 | 79 | 233 | 505 |
| 550 | 8.21 | 11.90 | -1.59 | 85 | 283 | 356 |
| 600 | 6.06 | 8.81 | -1.41 | 84 | 151 | 512 |
| 650 | 7.76 | 8.21 | -1.28 | 89 | 144 | 415 |
| 700 | 7.14 | 7.51 | -1.59 | 79 | 109 | 460 |

*FIG. 3*

RELAXED $In_xGa_{1-x}As$ BUFFERS

PRIORITY INFORMATION

This application is a continuation-in-part of Ser. No. 09/198,960 filed Nov. 24, 1998, now U.S. Pat. No. 6,232,138, which claims priority from provisional application Ser. No. 60/067,189 filed Dec. 1, 1997.

This invention was made with government support under Contract F30602-96-C-0178 awarded by the Air Force. The government has certain rights in the invention.

BACKGROUND OF THE INVENTION

The invention relates to the field of lattice-mismatched epitaxy, and in particular to the field of creating lattice-mismatched devices based on relaxed InGaAs alloys.

Most electronic and optoelectronic devices that require layers deposited by epitaxial growth utilize lattice-matched epitaxial layers, i.e. the crystal structure of the layer has the same lattice constant as that of the substrate. This lattice-matching criterion has been important in creating high quality materials and devices, since lattice-mismatch will create stress and in turn introduce dislocations and other defects into the layers. The dislocations and other defects will often degrade device performance, and more importantly, reduce the reliability of the device.

The applications of lattice-mismatched layers are numerous. In the InGaAs material system, one important composition is in the range of 20–30% In. These compositions would allow the fabrication of 1.3 μm optical devices on GaAs substrates, as well as high electron mobility transistors with superior performance on GaAs substrates. Alloys in the desired composition range are lattice-mismatched to GaAs and InP substrates, and therefore usually suffer from high dislocation densities. One known method to minimize the number of dislocations reaching the surface of a relaxed, mismatched layer is to compositionally grade the material (in this case through grading the In composition) so that the lattice-mismatched is reduced over a great thickness.

Compositional grading is typically accomplished in InGaAs alloys by grading the In composition at a low temperature of growth, typically less than 500° C. The dominant technique for depositing these relaxed layers in the InGaAs system has been molecular beam epitaxy (MBE). The MBE has a limited growth rate, and therefore the growth of these relaxed buffers is tedious and costly. A supply of virtual InGaAs substrates (i.e., a GaAs substrate with a relaxed InGaAs layer of high quality at the surface) would be in demand commercially, since the user could buy the substrate and deposit the device layers without having to deposit the graded InGaAs layer. To create a supply of these wafers at low cost, metalorganic chemical vapor deposition (MOCVD) offers greater potential.

There have been no successful reports of high quality relaxed graded InGaAs layers grown by MOCVD. There are fundamental materials problems with InGaAs graded layers grown in a certain temperature window. Thus, most attempts to grow relaxed layers with MOCVD have most likely failed for attempting to grow the layers under standard conditions, i.e. temperatures in the deleterious window.

SUMMARY OF THE INVENTION

It is therefore an object of the invention that with the appropriate grading rate, there is an unforeseen higher temperature window, which can be accessed with MOCVD and not MBE, in which high quality relaxed InGaAs alloys can be grown. Relaxed InGaAs grown with MOCVD in this temperature range have the economic advantages of using the MOCVD technique, as well as creating completely relaxed InGaAs layers of high quality.

Another object of the invention is to allow the fabrication of relaxed high quality InGaAs alloys on GaAs substrate with the MOCVD deposition technique. These virtual InGaAs substrates can be used in a variety of applications, in particular 1.3 μm optical devices and high-speed microwave transistors can be fabricated on such substrates. It is a further object of the invention to disclose the appropriate conditions during growth in which it is possible to achieve high quality material and devices using this InGaAs/GaAs.

$In_xGa_{1-x}As$ structures with compositionally graded buffers grown with organometallic vapor phase epitaxy (OMPVE) on GaAs substrates and characterized with plan-view and cross-sectional transmission electron microscopy (PV-TEM and X-TEM), atomic force microscopy (AFM), and x-ray diffraction (XRD). Surface roughness experiences a maximum at growth temperatures near 550° C. The strain fields from misfit dislocations induce a deleterious defect structure in the <110> directions. At growth temperatures above and below this temperature, the surface roughness is decreased significantly; however, only growth temperatures above this regime ensure nearly complete relaxed graded buffers with the most uniform composition caps and highest quality material. With the optimum growth temperature for grading $In_xGa_{1-x}As$ determined to be 700° C., it was possible to produce $In_{0.33}Ga_{0.67}As$ diodes on GaAs with threading dislocation densities $<8.5\times10^6/cm^2$.

Accordingly, the present invention provides a method of processing semiconductor materials, including providing a substrate of GaAs; and epitaxially growing a relaxed graded layer of $In_xGa_{1-x}As$ at a temperature ranging upwards from about 600° C.

The present invention also provides a semiconductor structure including a substrate of GaAs, and a relaxed graded layer of $In_xGa_{1-x}As$ which is epitaxially grown at a temperature ranging upwards from about 600° C.

These and other objects, features and advantages of the present invention will become apparent in light of the following detailed description of preferred embodiments thereof, as illustrated in the accompanying drawings.

BRIEF DESCRIPTION OF THE DRAWINGS

FIG. 3 is a table which shows the growth temperature, composition, and grading rate for nominal $x_{In}=0.06$ structures;

DETAILED DESCRIPTION OF THE INVENTION

Compositionally graded buffers are implemented in lattice mismatched heteroepitaxy to maintain a low threading dislocation density and to achieve a completely relaxed growth template. Organometallic vapor phase epitaxy (OMVPE) is a well-established growth technique that is capable of growth rates that are significantly greater than growth rates in molecular beam epitaxy (MBE). Therefore, OMVPE is a more practical growth tool for fabricating graded buffers. The ability to grow $In_xGa_{1-x}As$ graded buffers with OMVPE facilitates the manufacture of commercial lattice-mismatched devices, including 1.3 µm wavelength emitting lasers on GaAs.

Figure 1:
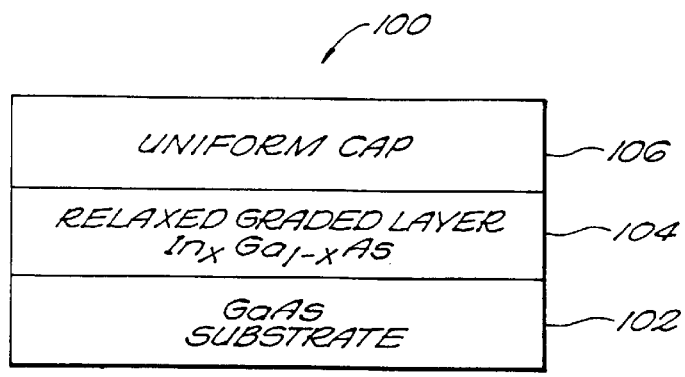
FIG. 1 is a simplistic block diagram of a semiconductor structure in accordance with the invention.

In accordance with the invention, $In_xGa_{1-x}As$ graded buffers are grown on GaAs substrates with atmospheric OMVPE at different growth temperatures. FIG. 1 is a simplistic block diagram of a semiconductor structure 100 including a substrate 102 of GaAs on which is grown a relaxed graded layer 104 of $In_xGa_{1-x}As$. Exemplary samples were grown in a Thomas Swan atmospheric research reactor on $n^+$GaAs substrates. The buffers were characterized with plan-view and cross-sectional transmission electron microscopy (PV-TEM and X-TEM), atomic force microscopy (AFM), and x-ray diffraction (XRD). The PV-TEM and X-TEM characterization was done with a JEOL 2000FX microscope. The XRD was performed with a Bede $D^3$ triple axis diffractometer. The AXM experiments were conducted with a Digital Instruments D3000 Nanoscope.

In order to explore graded $In_xGa_{1-x}As$ relaxation, exemplary samples were graded to $x_{In} \approx 0.06$ ($\approx 0.4\%$ mismatch). Such a small amount of mismatch should produce excellent relaxed layers independent of most growth parameters.

Undoped $In_xGa_{1-x}As$ graded buffers with nominal final indium concentration of $x_{In} = 0.06$ were grown at temperatures between 500–700° C. In addition, $x_{In} = 0.15$ and $x_{In} = 0.33$ graded buffers were grown at 700° C. All growths were performed with a 5000 sccm $H_2$ carrier flow and 134 sccm $AsH_3$ flow. The trimethylgallium (TMG) flow was fixed at 0.030 sccm throughout the graded buffer growth sequence. Compositional grading was accomplished by stepping the trimethylindium (TMI) flow rate by approximately 0.005 sccm up to a final flow of 0.031 sccm for the $x_{In} = 0.06$ graded buffer, 0.077 sccm for the $x_{In} = 0.15$ graded buffer, and 0.163 sccm for the $x_{In} = 0.33$ graded buffer. Sufficient vent times were incorporated after each change in TMI flow setting to ensure the expected composition, during which time the sample was kept at the growth temperature. All samples, except the structure with the $x_{In} = 0.33$ graded buffer, had an undoped 1 µm uniform cap layer 106. The sample with a $x_{In} = 0.33$ graded buffer had a 2 µm cap which incorporated a PIN diode structure.

Figure 2:
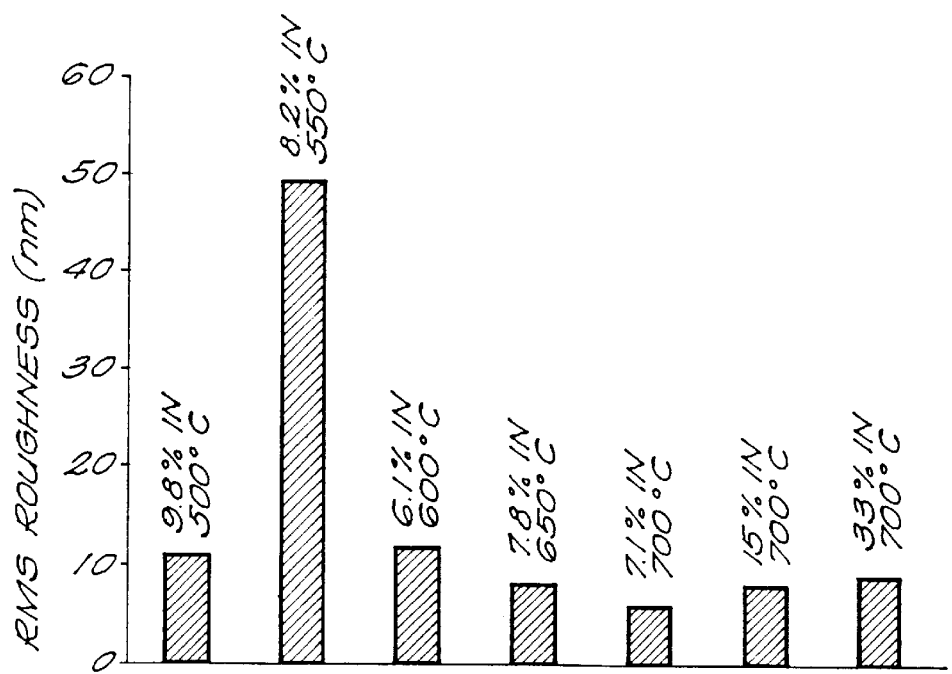
FIG. 2 is a graph illustrating RMS roughness for structures grown at different temperatures.

A visual inspection of the surface morphology reveals a strong dependence on growth temperature, a surprising result for such a low lattice mismatch. AFM surface topology data taken on 10 µm×10 µm areas of each sample, including the $x_{In} = 0.15$ and $x_{In} = 0.33$ structures is depicted in the graph of FIG. 2. The data show that the rms roughness for the nominal $x_{In} = 0.06$ sample grown at 550° C. has a significantly greater rms roughness value (52 nm) than the other structures which have an rms value of about 10 nm. In fact, despite the low mismatch, the sample grown at 550° C. is not specular to the eye, i.e., it is visibly rough. In addition, the surface roughness for the equivalent $x_{In} = 0.33$ structure grown at 770° C. was less than the surface roughness of $x_{In} = 0.06$ structures grown at all lower temperatures.

A criterion for applications is that there must be a great amount of strain relief and a low threading dislocation density. To determine the degree of strain relaxation and the indium composition, glancing exit (224) reciprocal space maps were conducted with triple axis XRD. Since the $x_{In} = 0.06$ structures were of low mismatch and relatively thin (2 µm) the effect of epilayer tilt was expected to be negligible, and thus no glancing incidence (224) or (004) reciprocal space maps were acquired to extract this effect.

X-TEM was used to measure the thickness and in combination with the final composition, the grading rate. FIG. 3 is a table which shows the growth temperature, composition, and grading rate for the nominal $x_{In} = 0.06$ structures. The table shows that the indium composition steadily increased with decreasing temperature (with the exception of the structure grown at 600° C.), which is due to the lower cracking temperature for TMI. In addition, the growth rate decreased with decreasing temperature, which in turn provided for a higher grading rate at lower temperature. It should be noted that there is a small error ($\approx 300$ Å) in the measurement of the graded buffer thickness due to the calibration of the TEM and the tilting of the TEM specimens.

FIG. 3 shows the residual strain in each of the nominal $x_{In} = 0.06$ structures as a function temperature. The structure grown at 500° C. had a noticeably greater residual strain left in the structure, and there is no general trend among the other samples. However, since the compositions and grading rates differed, the efficiency of the graded buffers at relieving strain was compared after calculating the equilibrium plastic strain rate (strain/thickness) and the overall equilibrium plastic strain.

The equilibrium plastic rate is given by $$C_\delta(h) = C_f + \frac{3D\left(1 - \frac{v}{4}\right)\ln\left(\frac{2\pi b C_\delta}{e}\right)}{2Yh^2} \quad (1)$$

where $C_f$ is the mismatch introduction rate (misfit/thickness), Y is the Young's modulus, h is the film height and $D = Gb/[2p(1-v)]$ with G, the shear modulus; v, Poisson's ratio; and b, the magnitude of the Bergers vector (60° dislocations are assumed). The expression for the overall plastic deformation in a graded buffer is:

$$\delta_{eq}(h) = C_\delta(h)h \quad (2)$$

The percentage of the equilibrium strain relieved (i.e., percent relaxation) is also listed in the table of FIG. 3. All the samples showed a similar degree of relaxation ($\approx 80–85\%$). At such a low mismatch it is difficult to distinguish the most effective growth conditions for strain relief. The disparities in strain relief were expected to be more pronounced at higher indium compositions. In general, higher growth temperatures would allow for more efficient strain relief.

Figure 4:
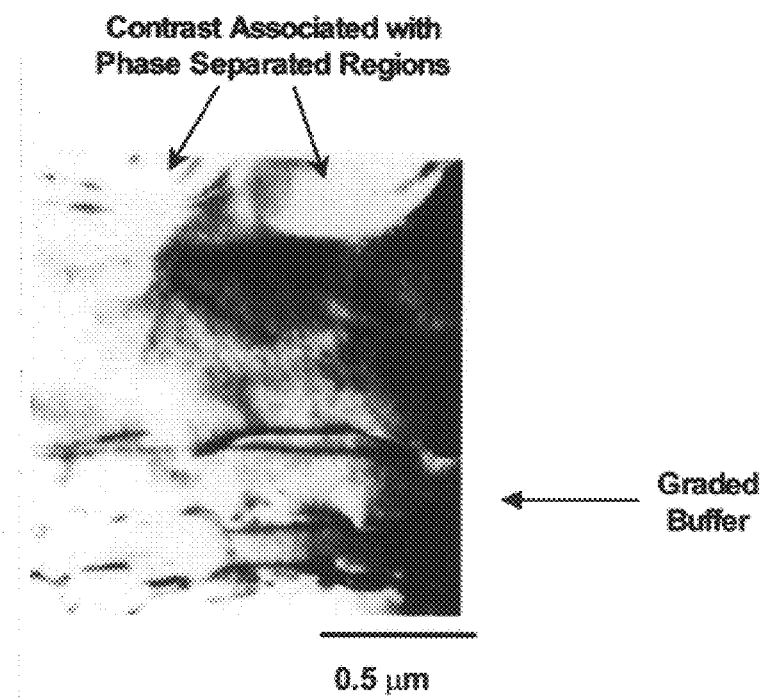
FIG. 4 is a X-TEM micrograph for a $x_{In}=0.06$ $In_xGa_{1-x}As$ structure grown at 550° C.
Figure 5:
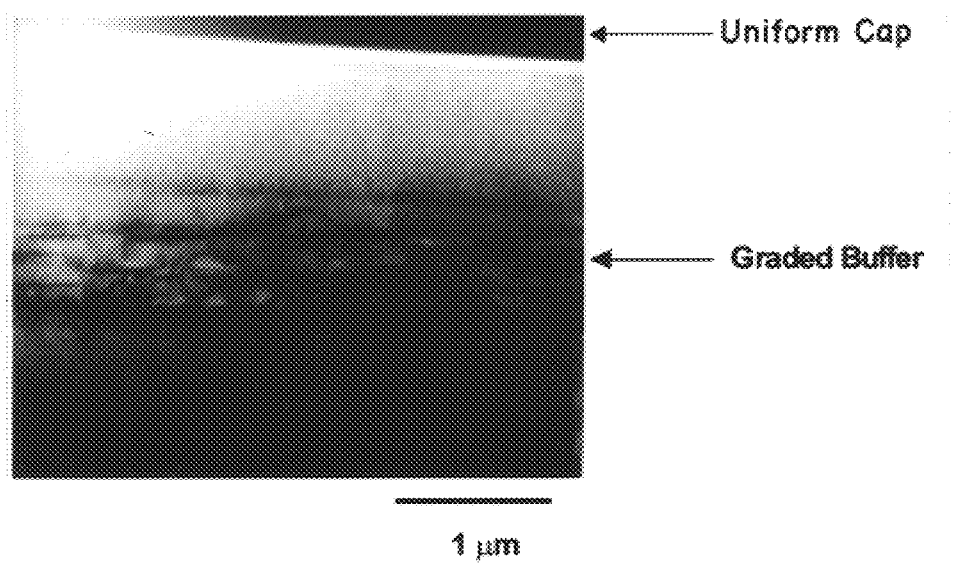
FIG. 5 is a X-TEM micrograph for a $x_{In}=0.06$ $In_xGa_{1-x}As$ structure grown at 700° C.

The X-TEM and XRD data exhibit differences in microstructure between the $x_{In} = 0.06$ sample grown at 550° C. and the same structure grown at 700° C., in agreement with the drastic difference in surface morphology. FIGS. 4 and 5 show the X-TEM micrographs of these two structures. Both structures have threading dislocation densities below the X-TEM limit ($<10^8/cm^2$). Thus, the very poor structure morphology of the 550° C. sample is not due to a very high defect density in the top $In_xGa_{1-x}As$ layer. The uniform cap layer of the structure grown at 550° C. does show-additional semi-circular regions in the top of the film. These features are not dislocations, as the contrast is weak, and are believed to be variations in strain from neighboring regions that may have undergone phase separation during growth. However, recent studies show that high-energy defects are formed in this temperature range, and their origin is uncertain.

Regardless, growth temperatures in this range near 550° C. lead to rough surface morphology which later leads to high threading dislocation densities.

A (224) glancing exit reciprocal space map of this structure shows a significantly greater spread in the 2θ direction for the uniform cap than any of the other samples grown at different temperatures. The FWHM data for the XRD peaks from the uniform caps are listed in the table of FIG. 3. It will be appreciated that the sharpest peak in the 2θ direction is from the sample grown at 700° C. The spread in the 2θ direction for the 550° C. sample is consistent with a spread in lattice constant due to indium composition variations or defect formations. In addition, the spread in the ω direction (FWHM data also tabulated in the table of FIG. 3) for the cap in the structure grown at 550° C. was less than that of the other $x_{In}$=0.06 samples, creating a circular projection of the (224) spot in reciprocal space, as opposed to the typical elliptical spot expected from a high quality relaxed heterostructure.

Figure 6:
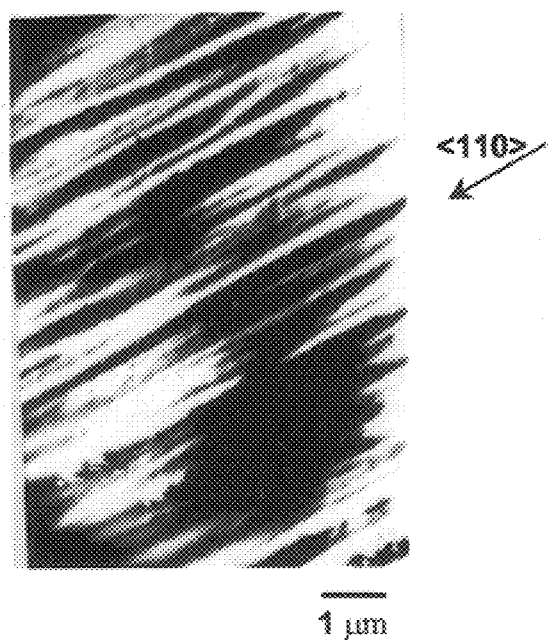
FIG. 6 is a PV-TEM micrograph of a $x_{In}=0.06$ structure grown at 550° C. (g=<220>)

FIG. 6 shows a plan view TEM image of the $x_{In}$=0.06 $In_xGa_{1-x}As$ structure grown at 550° C. showing striations under a g=<220> diffraction condition in <110> directions (the same direction as the dislocations in the graded buffer), which may be attributed to compositional variations due to phase separation and/or defect formation at the boundaries between regions. These striations disappear under the other g=<220> condition and g=<400 > conditions.

The data suggest that there is a correlation between the dislocations in the graded buffer and the observed boundary defects, which in turn cause the drastic surface roughening in the temperature regime where phase separation is favored. In the low temperature growth regime (500° C.), the surface roughening is kinetically limited, as the atoms do not have the mobility to attach to sites which cause the long range variations that are seen at higher growth temperatures. In the high temperature growth regime (>600° C.), thermodynamics dictate the growth conditions, as the growth occurs above the point at which such boundary defects are favorable.

At the growth temperatures within the range 500–600° C., the strained regions with boundaries form, as shown in FIG. 6. These features occur along the <110> direction since the misfit dislocations, their strain fields, and their cross-hatch surface lie along the <110> directions. As a consequence, the $In_xGa_{1-x}As$ layers roughen as surface energy is created and as strain energy is relieved. It will be appreciated that this roughening (i.e., very pronounced cross-hatch pattern), is much more severe than the roughening that occurs in systems which lack this apparent phase instability.

Although the X-TEM image of the $x_{In}$=0.06 structure grown at 550° C. did not show threading dislocations, it has been shown in the $Si_xGe_{1-x}$ materials system that a rough surface with increasing lattice mismatch will eventually lead to a high threading dislocation density even in structures with slow grading rates, as described in Samavedam et al., "Novel Dislocation Structure and Surface Morphology Effects in Relaxed Ge/SiGe/Si Structures", J. Appl. Phys., 81(7), 3108 (1997), incorporated herein by reference. Grading to greater indium compositions at 550° C. produces very rough surfaces that eventually lead to high threading dislocation densities. Although surface roughness can be decreased by growing at lower temperature, this cannot be achieved without compromising the relaxation of the graded buffer. This implies that the only window for growth of $In_xGa_{1-x}As$ graded buffers which provides both relaxation and good surface morphology is at high temperature. It is important to note that MBE can not attain such high growth temperatures due to limited arsenic overpressure.

Figure 7:
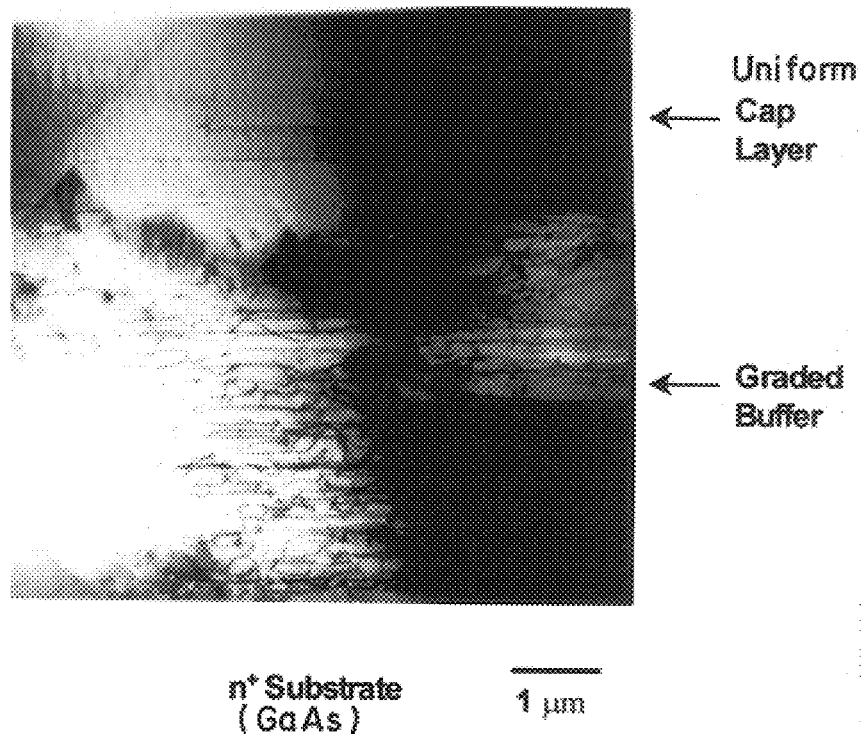
FIG. 7 is an X-TEM micrograph of a $x_{In}=0.33$ $In_xGa_{1-x}As$ structure grown at 700° C.

With surface roughness and relaxation conditions determined to be optimum at a growth temperature of 700° C., a $x_{In}$=0.33 device structure was grown. FIG. 7 is an X-TEM micrograph of this structure with no threading dislocations within the X-TEM limit. No threading dislocations could be observed in PV-TEM, showing that the threading dislocation density in this structure is <8.5×10$^6$/cm$^2$ given this size of viewable area in TEM. (224) glancing incidence and glancing exit θ/2θ double axis XRD scans showed the composition to be $x_{In}$=0.33 and the structure was 99.39% relaxed.

Accordingly, it has been demonstrated that growth of $In_xGa_{1-x}As$ graded buffers is sensitive to the growth temperature. In the temperature range approximately between 500 and 600° C., the surface morphology of the structures degrades and rapidly leads to poor quality layers, even at relatively low mismatch. Only growth at higher temperatures produces relaxed layers with sufficient relaxation, good surface morphology, and low threading dislocation densities. The low threading dislocation densities are sufficient for the fabrication of electronic and optoelectronic devices such as 1.3 μm wavelength emitting lasers.

Figure 8:
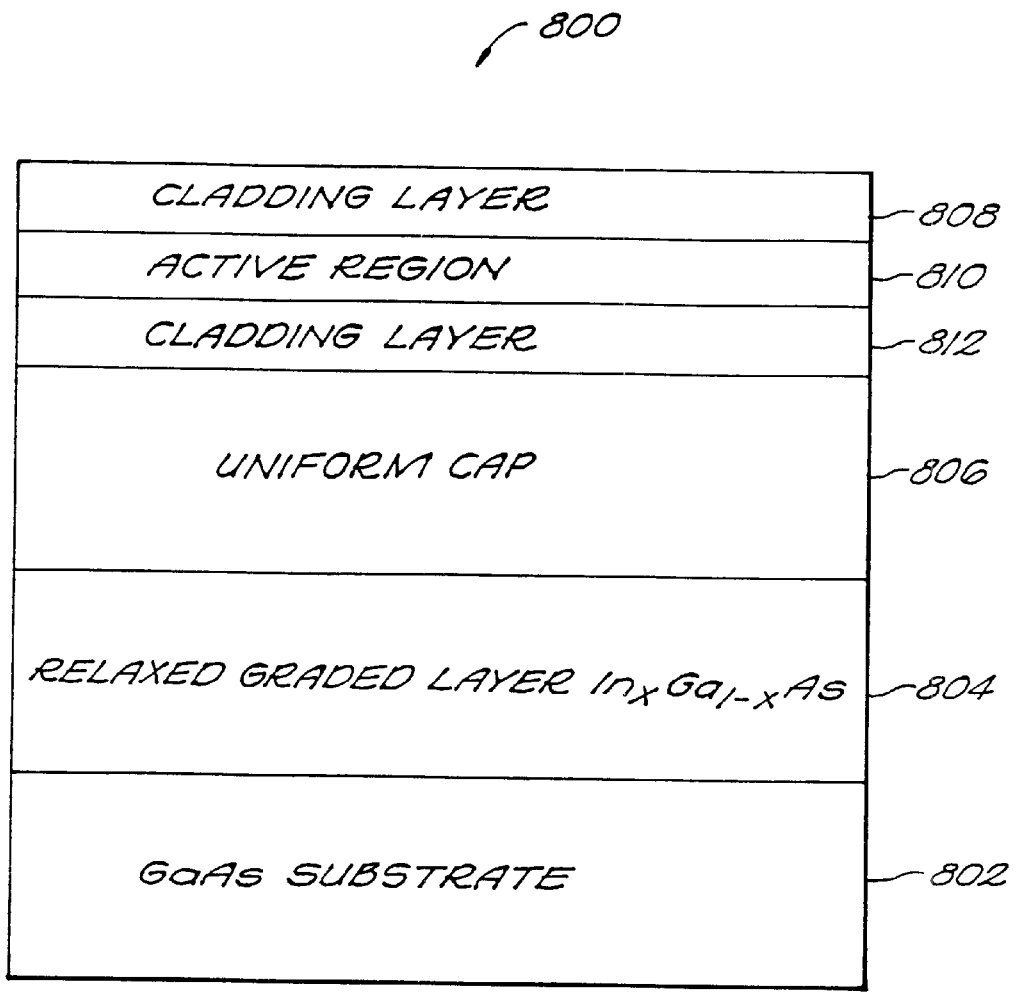
FIG. 8 is a simplistic block diagram of a semiconductor structure of the invention with a device configured thereon.

As shown in FIG. 8, once a virtual substrate of $In_xGa_{1-x}As$ is created, new optoelectronic and electronic devices can be configured on top of the structure. For example, analogous to heterostructures grown on GaAs substrate, heterostructure devices composed of other alloy compositions can now be fabricated on these substrates. Layers 808, 810, 812 provided on the structure 800 can be layers of the $Al_y(In_xGa_{1-x})_{1-y}As$ or the $In_xGa_{1-x}As_{-y}P_y$ alloy families. These alloys can be used to create 1.3 μm heterostructure layers on GaAs substrates, a great advantage over the 1.3 μm devices that need to be grown on InP substrates due to the lattice-matching criterion. In the illustrated embodiment, layers 808 and 812 are the cladding layers of a heterostructure laser, and 810 is the active region. $In_xGa_{1-x}P$ is often chosen for the cladding layers since the absence of Al results in better device reliability.

Similar heterostructures from the $Al_y(In_xGa_{1-x})_{1-y}As$ alloy system on these virtual $In_xGa_{1-x}As$ buffer layers can be fabricated into high transconductance field effect transistors (FETs) useful in microwave applications. The virtual substrate allows the electron channel or active region (810 in FIG. 8) to be composed of much higher In concentrations than FETs grown on GaAs without the virtual buffer. The higher In concentration in the channel results in very high electron mobilities, and the large band off-sets that can be created in the $Al_y(In_xGa_{1-x})_{1-y}As$ heterostructure system (810–812) create a very high electron concentration in the channel. Thus, the high mobility and high electron concentrations lead to transistors with very high transconductance.

Even greater quality buffers can be created through combining the invention with other known improvements for graded layers, such as the use of planarization techniques to lower defect densities in graded buffers.

Although the present invention has been shown and described with respect to several preferred embodiments thereof, various changes, omissions and additions to the form and detail thereof, may be made therein, without departing from the spirit and scope of the invention.

What is claimed is:

1. An integrated circuit comprising a heterostructure for a 1.3 μm wavelength laser, said heterostructure comprising a GaAs substrate, a relaxed graded layer of $In_xGa_{1-x}As$ which is epitaxially grown on said substrate at a temperature ranging upwards from about 600° C., and semiconductor device layers.

2. The integrated circuit of claim 1, wherein a uniform layer of $In_yGa_{1-y}As$ is positioned between said relaxed graded layer and said semiconductor device layers.

3. The integrated circuit of claim 1, wherein said semiconductor device layers are comprised of a first cladding layer, an active layer, and a second cladding layer.

4. The integrated circuit of claim 3, wherein said first cladding layer comprises $Al_z(In_wGa_{1-w})_{1-z}As$, said active layer comprises $Al_t(In_uGa_{1-u})_{1-t}As$, and said second cladding layer comprises $Al_v(In_rGa_{1-r})_{1-v}As$.

5. The integrated circuit of claim 4, wherein z is approximately equal to v and w is approximately equal to r.

6. The integrated circuit of claim 3, wherein said first cladding layer comprises $In_wGa_{1-w}As_{1-z}P_z$, said active layer comprises $In_tGa_{1-t}As_{1-u}P_u$, and said second cladding layer comprises $In_vGa_{1-v}As_{1-r}P_r$.

7. The integrated circuit of claim 6, wherein z and r are approximately equal to 1.

8. The integrated circuit of claim 1, wherein said relaxed graded layer is epitaxially grown at a temperature of approximately 700° C.

9. The integrated circuit of claim 1, wherein said relaxed graded layer is epitaxially grown with organometallic vapor phase epitaxy (OMVPE).

10. The integrated circuit of claim 1, wherein the degree of relaxation of said relaxed graded layer is from about 90% to 100% for x>0.25.

11. The integrated circuit of claim 8, wherein said relaxed graded layer is epitaxially grown while increasing the content of In at a gradient of less than about 15% per micron to a final composition in the range of 0.1<x<1.0.

12. An integrated circuit comprising a heterostructure for a field-effect transistor (FET), said heterostructure comprising a GaAs substrate, a relaxed graded layer of $In_xGa_{1-x}As$ which is epitaxially grown on said substrate at a temperature ranging upwards from about 600° C., and an active layer.

13. The integrated circuit of claim 12, wherein a uniform layer of $In_yGa_{1-y}As$ is positioned between said relaxed graded layer and said active layer.

14. The integrated circuit of claim 12, wherein said active layer comprises $Al_z(In_wGa_{1-w})_{1-z}As$.

15. The integrated circuit of claim 12, wherein said relaxed graded layer is epitaxially grown at a temperature of approximately 700° C.

16. The integrated circuit of claim 12, wherein said relaxed graded layer is epitaxially grown with organometallic vapor phase epitaxy (OMVPE).

17. The integrated circuit of claim 12, wherein the degree of relaxation of said relaxed graded layer is from about 90% to 100% for x>0.25.

18. The integrated circuit of claim 15, wherein said relaxed graded layer is epitaxially grown while increasing the content of In at a gradient of less than about 15% per micron to a final composition in the range of 0.1<x<1.0.

* * * * *